United States Patent
Kim

(10) Patent No.: US 9,671,467 B2
(45) Date of Patent: Jun. 6, 2017

(54) ELECTRIC POWER METER CAPABLE OF MONITORING CONTACT STATUS OF LATCH RELAY

(71) Applicant: LSIS CO., LTD., Anyang-si, Gyeonggi-do (KR)

(72) Inventor: Hyung Kyu Kim, Cheongju-si (KR)

(73) Assignee: LSIS CO., LTD., Anyang-si (KR)

( * ) Notice: Subject to any disclaimer, the term of this patent is extended or adjusted under 35 U.S.C. 154(b) by 291 days.

(21) Appl. No.: 14/665,882

(22) Filed: Mar. 23, 2015

(65) Prior Publication Data

US 2015/0316932 A1    Nov. 5, 2015

(30) Foreign Application Priority Data

Apr. 30, 2014 (KR) ......................... 10-2014-0052767

(51) Int. Cl.
| | |
|---|---|
| *G01R 31/327* | (2006.01) |
| *G01R 11/32* | (2006.01) |
| *G05B 15/02* | (2006.01) |
| *G05F 1/66* | (2006.01) |
| *G01R 21/00* | (2006.01) |
| *G01R 21/133* | (2006.01) |
| *G01R 11/25* | (2006.01) |

(52) U.S. Cl.
CPC .......... *G01R 31/3278* (2013.01); *G01R 11/25* (2013.01); *G01R 21/00* (2013.01); *G01R 21/133* (2013.01); *G01R 31/3277* (2013.01); *G05B 15/02* (2013.01); *G05F 1/66* (2013.01)

(58) Field of Classification Search
CPC ............ G01R 31/3278; G01R 31/3277; G01R 21/133; G01R 21/00; G01R 11/25
USPC ......................................... 324/415, 418, 142
See application file for complete search history.

(56) References Cited

U.S. PATENT DOCUMENTS

| | | | |
|---|---|---|---|
| 4,961,051 A | 10/1990 | Tjebben | |
| 9,252,588 B2 * | 2/2016 | Dani ...................... | H02H 3/207 |

(Continued)

FOREIGN PATENT DOCUMENTS

| | | |
|---|---|---|
| FR | 2987449 | 8/2013 |
| GB | 2197491 | 5/1988 |
| KR | 10-1017761 | 2/2011 |

OTHER PUBLICATIONS

European Patent Office Application Serial No. 15163508.3, Search Report dated Oct. 7, 2015, 5 pages.

*Primary Examiner* — Amy He
(74) *Attorney, Agent, or Firm* — Lee, Hong, Degerman, Kang & Waimey

(57) ABSTRACT

An electric power meter capable of monitoring a contact status of a latch relay, comprises: a latch relay having a pair of primary coils and a secondary contact, the secondary contact operable to a closed position or an open position, the primary coils configured to provide a magnetic force to open or close the secondary contact; and a meter controller configured to determine that the latch relay is in a closed position when the input voltage of the primary coils is substantially equal to the output voltage of the secondary contact with a predetermined allowable error range, and configured to determine that the latch relay is in an open position when the output voltage of the secondary contact has not been input, even if the input voltage of the primary coils has been input.

5 Claims, 3 Drawing Sheets

(56) References Cited

U.S. PATENT DOCUMENTS

2008/0258709 A1* 10/2008 Shuey .............. G01R 19/16547
324/110
2012/0119918 A1 5/2012 Williams

* cited by examiner

ELECTRIC POWER METER CAPABLE OF MONITORING CONTACT STATUS OF LATCH RELAY

CROSS-REFERENCE TO RELATED APPLICATION

Pursuant to 35 U.S.C. §119(a), this application claims the benefit of earlier filing date and right of priority to Korean Application No. 10-2014-0052767, filed on Apr. 30, 2014, the contents of which is incorporated by reference herein in its entirety.

BACKGROUND OF THE INVENTION

1. Field of the Invention

This specification relates to a digital electric power meter or a smart meter, and more particularly, to an electric power meter capable of monitoring a contact status of a latch relay mounted to a digital electric power meter or a smart meter, the latch relay capable of opening or closing at least one of power supply lines connected from an electric power source to an electric load.

2. Background of the Invention

The conventional digital electric power meter having a function to open and close power supply lines connected to a load side may be referred by the patent document registered by the present applicant (Patent Document 1: KR10-1017761 B1).

In the conventional digital electric power meter disclosed in the aforementioned patent document, even if a controller of the digital electric power meter has output a command signal for opening or closing a contact of a latch relay which opens or closes electric power lines, to the latch relay, the contact of the latch relay may not be open or closed in response to the command signal, due to failure of the latch relay, inferiority of a control power supplied to the latch relay, etc. In this case, since an open or closed status of the latch relay is determined based on the control signal of the controller, an open or closed status different from the current actual open or closed status may be displayed on a display unit of the digital electric power meter. That is, a power supply status or a power interruption status different from the actual power supply status or power interruption status may be erroneously displayed on the display unit.

SUMMARY OF THE INVENTION

Therefore, an object of the present invention is to provide an electric power meter capable of monitoring whether electric power supply from an electric power source to an electric load is performed or interrupted according to a control command, by sensing a contact status of a latch relay.

Another aspect of the detailed description is to provide an electric power meter capable of determining whether a latch relay is normal or abnormal by comparing a control command by a meter controller with an actual contact status of the latch relay, and capable of transmitting data on a determined status (a normal or abnormal status) of the latch relay, to a host system.

To achieve these and other advantages and in accordance with the purpose of this disclosure, as embodied and broadly described herein, there is provided an electric power meter according to the present invention capable of monitoring a contact status of a latch relay, the electric power meter comprising:

a latch relay having a pair of primary coils and a secondary contact, the secondary contact operable to a closed position where an electric power from an electric power source is supplied to an electric load, or an open position where power supply from the power source to the load side is interrupted, the primary coils configured to provide a magnetic force to open or close the secondary contact; and a meter controller connected to the latch relay, configured to compare an input voltage of the primary coils of the latch relay with an output voltage of the secondary contact of the latch relay, configured to determine that the latch relay is in a closed position when the input voltage of the primary coils is substantially equal to the output voltage of the secondary contact with a predetermined allowable error range, and configured to determine that the latch relay is in an open position when the output voltage of the secondary contact has not been input, even if the input voltage of the primary coils has been input.

The electric power meter according to the present disclosure further comprises a communication unit configured to transmit error status information to a host system when an error is determined by the meter controller, or configured to transmit command status information on the latch relay and status information on an output voltage of the secondary contact, to a host system such that the host system determines an error status.

According to one aspect of the present invention, the meter controller is configured to determine an error and to display the error, in a case where an output voltage of the secondary contact has not been input from the latch relay despite a closed status where a control signal for operating the latch relay to a closed position has been output to the latch relay, or in a case where an output voltage of the secondary contact has been input from the latch relay despite an open status where a control signal for operating the latch relay to an open position has been output to the latch relay, and wherein the electric power meter further comprises a meter display unit connected to the meter controller and configured to display the error status.

According to another aspect of the present invention, the meter controller the meter controller comprises a program storage unit configured to:

compare an input voltage of the primary coils of the latch relay with an output voltage of the secondary contact of the latch relay, determine that the latch relay is in a closed position when the input voltage of the primary coils is substantially equal to the output voltage of the secondary contact with a predetermined allowable error range, and determine that the latch relay is in an open position when the output voltage of the secondary contact has not been input, even if the input voltage of the primary coils has been input.

According to still another aspect of the present invention, the meter controller comprises a program storage unit configured to determine an error, in a case where an output voltage of the secondary contact has not been input from the latch relay despite a closed status where a control signal for operating the latch relay to a closed position has been output to the latch relay, or in a case where an output voltage of the secondary contact has been input from the latch relay despite an open status where a control signal for operating the latch relay to an open position has been output to the latch relay.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Description will now be given in detail of preferred configurations of mobile terminals according to the present invention, with reference to the accompanying drawings.

A configuration and effects of the present invention having the aforementioned objects may be understood more specifically by the following descriptions with reference to FIGS. 1 to 4 according to an embodiment of the present invention.

Figure 1:
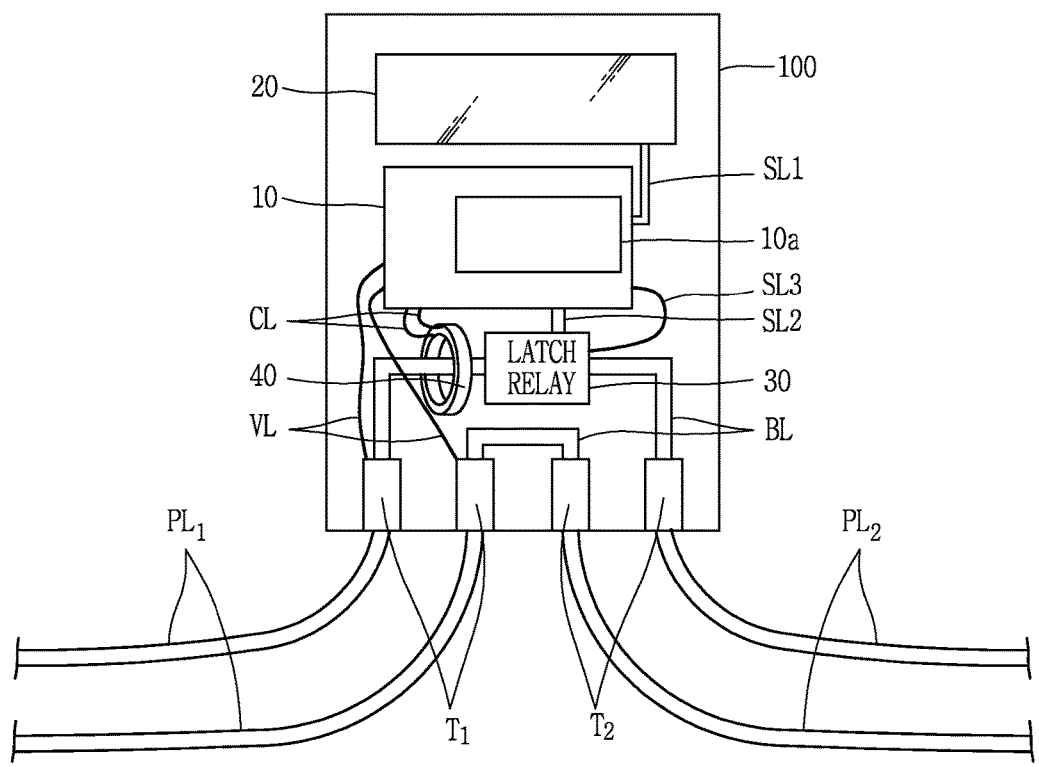
FIG. 1 is a block diagram illustrating a configuration of an electric power meter capable of monitoring a contact status of a latch relay according to the present invention.

As shown in FIG. 1, an electric power meter 100 capable of monitoring a contact status of a latch relay according to an embodiment of the present invention includes a latch relay 30 and a meter controller 10a.

Referring to FIG. 1, reference numeral 10 designates a main meter printed circuit board (abbreviated as main meter PCB hereinafter) having a circuitry part including a meter controller 10a.

Reference numeral 20 designates a meter display unit provided in the electric power meter 100, connected to the meter controller 10a, and configured to display an electric power meter value including an error status. The meter display unit 20 is connected to the meter controller 10a through a signal line (SL1) and the main meter PCB 10.

Reference numeral 40 designates a current transformer for detecting the amount of current flowing through electric power lines.

Reference character PL1 designates electric power incoming lines through which an electric power from a power source comes, and PL2 designates an electric load side power lines through which electric power is supplied to the electric load.

Reference character T1 designates incoming terminals provided at the electric power meter 100 and to which the electric power incoming lines (PL1) are connected. Reference character T2 designates outgoing terminals provided at the electric power meter 100 and to which the electric load side power lines (PL2) are connected.

Reference character VL designates voltage signal lines connected between the main meter PCB 10 and the incoming terminals (T1) in the electric power meter 100, and serving as a medium to transmit a detected voltage signal of the electric power lines. Reference character CL designates current signal lines connected between the main meter PCB 10 and the current transformer 40 in the electric power meter 100, and serving as a medium to transmit a detected current signal of the electric power lines.

Reference character BL designates inner lines connected between the incoming terminals (T1) and the outgoing terminals (T2) in the electric power meter 100.

Figure 2:
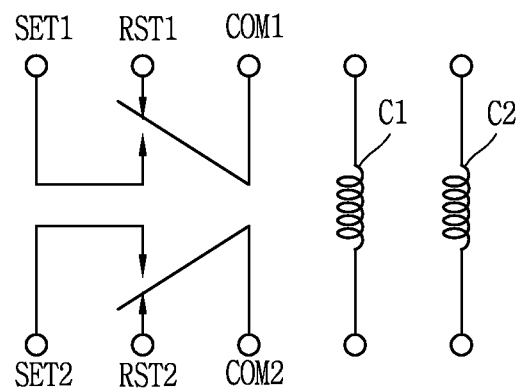
FIG. 2 is view illustrating a configuration of a latch relay.

As shown in FIG. 2, the latch relay 30 comprises primary coils and a secondary contact.

The primary coils provide a magnetic force for opening and closing a secondary contact, respectively. In FIG. 2, the primary coils include a set coil (C1) and a reset coil (C2).

The set coil (C1) applies a magnetic force to the secondary contact of the latch relay 30 when magnetized, thereby allowing the secondary contact to come in contact with set terminals (SET1, SET2). The set terminals (SET1, SET2) are parts formed as intermediate portions of the inner lines (BL) of FIG. 1 are cut, such that the inner lines (BL) of FIG. 1 form a closed status through contact of the secondary contact. When the secondary contact is in a contacted status with the set terminals (SET1, SET2), common terminals (COM1, COM2) are electrically connected to the electric power incoming lines (PL1) through the inner lines (BL). As a result, electric power from an electric power source can be supplied to an electric load side, through the outgoing terminals (T2) and the electric load side power lines (PL2).

The reset coil (C2) applies a magnetic force to the secondary contact of the latch relay 30 when magnetized, thereby allowing the secondary contact to come in contact with reset terminals (RST1, RST2). The reset terminals (RST1, RST2) are open end parts not connected to the inner lines (BL) of FIG. 1, such that the inner lines (BL) form an open status through contact of the secondary contact, for breaking of electric power supply. When the secondary contact is in a contacted status with the reset terminals (RST1, RST2), the common terminals (COM1, COM2) are disconnected from the inner lines (BL), and thus the electric power incoming lines (PL1) are electrically disconnected from the common terminals (COM1, COM2). As a result, electric power supply from the electric power source to the electric load side, through the outgoing terminals (T2) and the electric load side power lines (PL2) is broken.

The secondary contact (reference numeral not given) is configured as a contact which can be switched to a closed position for supplying electric power from the electric power source to the electric load side, or an open position for breaking electric power supply from the electric power source to the load side. That is, as aforementioned, the secondary contact may contact the set terminals (SET1, SET2) when the set coil (C1) is magnetized, thereby having a closed position for supplying electric power from the electric power source to the load side. Further, the secondary contact may contact the reset terminals (RST1, RST2) when the reset coil (C2) is magnetized, thereby having an open position for breaking electric power supply from the power source to the load side.

An input voltage of the primary coils of the latch relay 30, i.e., an input voltage of the set coil (C1) or the reset coil (C2) may be detected by a configuration including a first voltage detection signal line (SL2) connected to the set coil (C1) or the reset coil (C2), and including a first voltage-dividing resistors (VDR1). Then, the input voltage may be provided to the meter controller 10a. The first voltage-dividing resistors (VDR1) are configured by resistors connected to the first voltage detection signal line (SL2) in parallel, and is configured to convert a voltage to be detected into a small voltage proportional to the voltage. The first voltage-dividing resistors (VDR1), a means to detect a voltage, may be replaced by a potential transformer according to another embodiment of the present invention.

Likewise, an output voltage of the secondary contact of the latch relay 30 may be detected by a configuration including a second voltage detection signal line (SL3) connected to the secondary contact, and a second voltage-dividing resistors (VDR2). Then, the output voltage may be provided to the meter controller 10a. The second voltage-dividing resistors (VDR2) is configured by resistors connected to the second voltage detection signal line (SL3) in parallel. The second voltage-dividing resistors (VDR2) may be also replaced by a potential transformer.

The meter controller 10a is connected to the latch relay 30 through the first voltage detection signal line (SL2) and the second voltage detection signal line (SL3).

The meter controller 10a compares the input voltage of the primary coils of the latch relay 30 received through the first voltage detection signal line (SL2), with the output voltage of the secondary contact of the latch relay 30 received through the second voltage detection signal line (SL3). If the input voltage of the primary coils is substantially equal to the output voltage of the secondary contact, within a predetermined allowable error range, the meter controller 10a determines that the latch relay 30 is in a closed position.

If the output voltage of the secondary contact has not been input even if the input voltage of the primary coils has been input, the meter controller 10a determines that the latch relay 30 is in an open position. For such a determination, the meter controller 10a may include a first program storage unit 10b configured to provide programs for performing corresponding determination processes.

Further, the meter controller 10a may be configured to determine an error and to display the error, in a case where an output voltage of the secondary contact has not been input from the latch relay 30, despite a closed status (a closing commanded status) where a control signal for operating the latch relay 30 to a closed position has been output to the latch relay 30, or in a case where an output voltage of the secondary contact has been input from the latch relay 30 despite an open status (an open-commanded status) where a control signal for operating the latch relay 30 to an open position has been output to the latch relay 30. For such an error determination process, the meter controller 10a may comprise a second program storage unit 10c configured to provide programs (in other words algorithm) for performing corresponding determination processes.

The main meter PCB 10 shown in FIG. 1 may further include a communication unit 10d configured to transmit error status information to a host system when an error is determined by the meter controller 10a, or configured to transmit command status information on the latch relay 30 and status information on an output voltage of the secondary contact, to a host system such that the host system determines an error status.

The host system may be a server computer of an apartment house management office or a server computer of an electric power supplying company, each connected to the electric power meter 100 in a wired or wireless manner.

Figure 3:
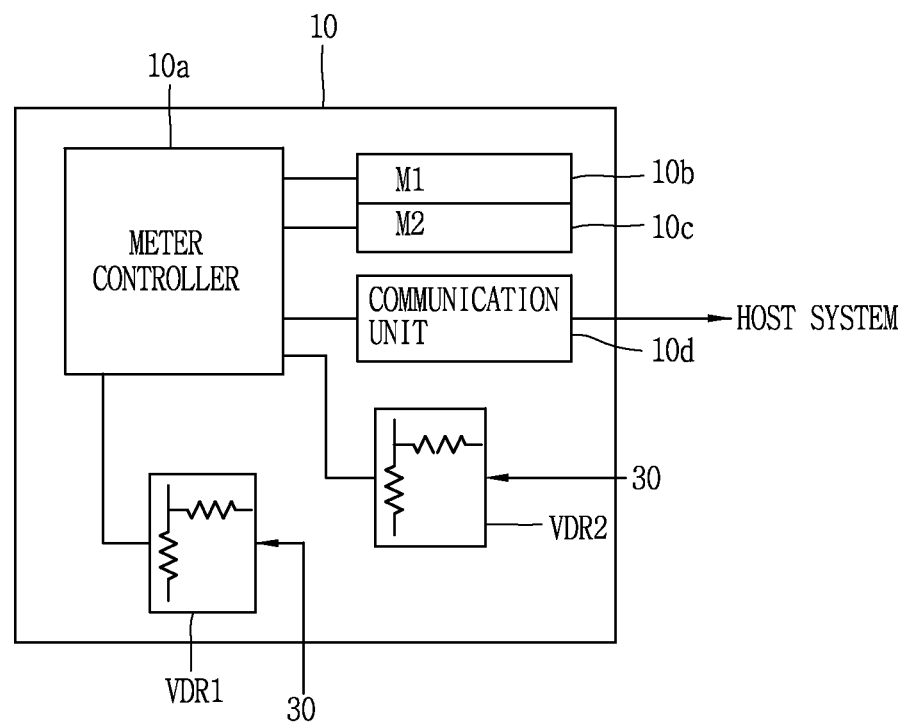
FIG. 3 is a block diagram illustrating a detail configuration of a main meter printed circuit board in an electric power meter.
Figure 4:
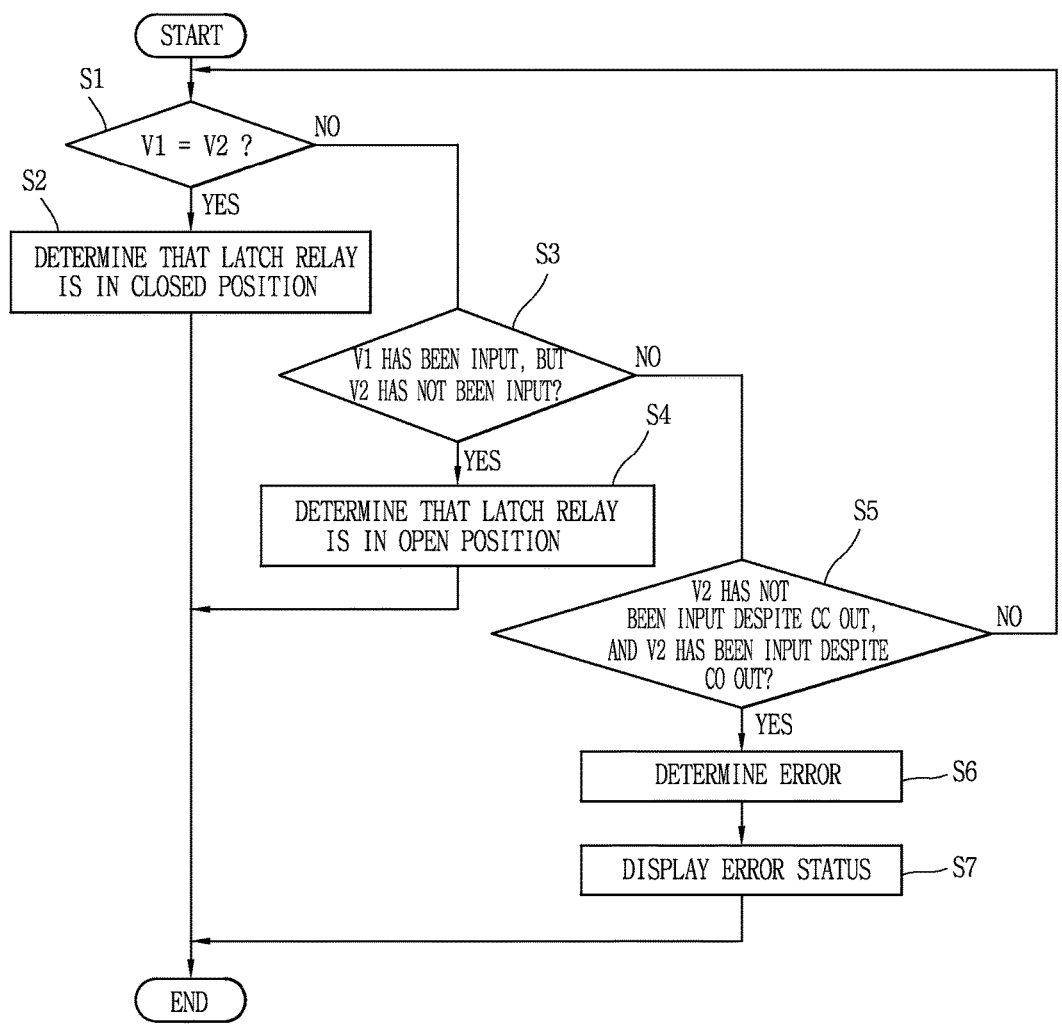
FIG. 4 is a flowchart illustrating a method of determining a contact position of a latch relay, and a method of determining an error, by a meter controller included in an electric power meter according to the present invention.

In the aforementioned electric power meter according to an embodiment of the present invention, a method of determining a contact position of the latch relay and determining an error by the meter controller will be explained with reference to FIG. 4 mainly, and with reference to FIGS. 1 to 3 subsidiarily.

Firstly, the meter controller 10a reads out processing programs from the first program storage unit 10b and the second program storage unit 10c. In this status, the meter controller 10a compares an input voltage (V1) of the primary coils of the latch relay 30, input through the first voltage-dividing resistor (VDR1), with an output voltage (V2) of the secondary contact of the latch relay 30, input through the second voltage-dividing resistor (VDR2) (S1).

If the input voltage (V1) of the primary coils is substantially equal to the output voltage (V2) of the secondary contact as a comparison result in S1, the meter controller 10a determines that the latch relay 30 is in a closed position (S2). The meaning that the input voltage (V1) of the primary coils is substantially equal to the output voltage (V2) of the secondary contact, may correspond to a difference between the input voltage (V1) and the output voltage (V2) is within a predetermined allowable error range.

If the input voltage (V1) of the primary coils is not equal to the output voltage (V2) of the secondary contact as a comparison result in S1, operation of the meter controller 10a proceeds to S2 to thus check that the output voltage (V2) of the secondary contact has not been input even if the input voltage (V1) of the primary coils has been input.

If the output voltage (V2) of the secondary contact has not been input even if the input voltage (V1) of the primary coils has been input, the meter controller 10a determines that the latch relay 30 is in an open position (S4).

If the output voltage (V2) of the secondary contact has not been input, even if the input voltage (V1) of the primary coils has been input in S2, operation of the meter controller 10a proceeds to S3 to thus check whether an output voltage (V2) of the secondary contact has not been input from the latch relay 30 despite a closed status (more specifically, a closing commanded status) where a control signal for operating the latch relay 30 to a closed position has been output to the latch relay 30, or whether an output voltage (V2) of the secondary contact has been input from the latch relay 30 despite an open status (more specifically, an open commanded status) where a control signal for operating the latch relay 30 to an open position has been output to the latch relay 30.

In S6, the meter controller 10a determines an error, in a case where an output voltage (V2) of the secondary contact has not been input from the latch relay 30 despite a closed status (the closing commanded status) where a control signal for operating the latch relay 30 to a closed position has been output to the latch relay 30, or in a case where an output voltage (V2) of the secondary contact has been input from the latch relay 30 despite an open status (the open commanded status) where a control signal for operating the latch relay 30 to an open position has been output to the latch relay 30.

In S7, the meter controller 10a outputs a command signal to the meter display unit 20 connected thereto, such that the meter display unit 20 displays an error status.

When an error is determined, the meter controller 10a can be configured to transmit error status information to a host system through the communication unit 10d, or transmits command status information on the latch relay 30 and status information on an output voltage (V2) of the secondary contact, to a host system such that the host system determines an error status.

As aforementioned, in the electric power meter capable of monitoring a contact status of a latch relay according to the present invention, the input voltage (V1) of the primary coils of the latch relay 30 is compared with the output voltage (V2) of the secondary contact of the latch relay 30. As a comparison result, if the input voltage (V1) of the primary coils is substantially equal to the output voltage (V2) of the secondary contact within a predetermined allowable error range, it is determined that the latch relay 30 is in a closed position. On the contrary, if the output voltage (V2) of the secondary contact has not been input, even if the input voltage (V1) of the primary coils has been input, it is determined that the latch relay 30 is in an open position. Thus, it can be monitored whether electric power supply from an electric power source to an electric load side is duly performed or broken according to a control command, as a contact status of the latch relay 30 is sensed.

Further, the electric power meter capable of monitoring a contact status of a latch relay according to the present invention further includes the communication unit 10d. By the communication unit 10d, error status information can be transmitted to a host system when an error is determined by the meter controller 10a, or command status information on the latch relay 30 and status information on an output voltage (V2) of the secondary contact can be transmitted to a host system such that the host system determines an error status.

Further, in the electric power meter capable of monitoring a contact status of a latch relay according to the present invention, the meter controller 10a determines an error when a command signal for an open or closed status does not match an actual output voltage (V2) of the secondary contact as a comparison result, and outputs an error status for display. The electric power meter includes the meter display unit 20 for displaying an error status. Accordingly, an error can be detected based on a command signal for an open or closed status, and based on an actual contact status, and the error can be displayed on the meter display unit 20.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. An electric power meter capable of monitoring a contact status of a latch relay, the electric power meter comprising:
   a latch relay having a pair of primary coils and a secondary contact, the secondary contact operable to a closed position where an electric power from an electric power source is supplied to an electric load, or an open position where power supply from the power source to the load side is interrupted, the primary coils configured to provide a magnetic force to open or close the secondary contact; and
   a meter controller connected to the latch relay, configured to compare an input voltage of the primary coils of the latch relay with an output voltage of the secondary contact of the latch relay, configured to determine that the latch relay is in a closed position when the input voltage of the primary coils is substantially equal to the output voltage of the secondary contact with a predetermined allowable error range, and configured to determine that the latch relay is in an open position when the output voltage of the secondary contact has not been input, even if the input voltage of the primary coils has been input.

2. The electric power meter of claim 1, further comprising a communication unit configured to transmit error status information to a host system when an error is determined by the meter controller, or configured to transmit command status information on the latch relay and status information on an output voltage of the secondary contact, to a host system such that the host system determines an error status.

3. The electric power meter of claim 1, wherein the meter controller is configured to determine an error and to display the error, in a case where an output voltage of the secondary contact has not been input from the latch relay despite a closed status where a control signal for operating the latch relay to a closed position has been output to the latch relay, or in a case where an output voltage of the secondary contact has been input from the latch relay despite an open status where a control signal for operating the latch relay to an open position has been output to the latch relay, and
   wherein the electric power meter further comprises a meter display unit connected to the meter controller and configured to display the error status.

4. The electric power meter of claim 1, wherein the meter controller comprises a program storage unit configured to:
   compare an input voltage of the primary coils of the latch relay with an output voltage of the secondary contact of the latch relay,
   determine that the latch relay is in a closed position when the input voltage of the primary coils is substantially equal to the output voltage of the secondary contact with a predetermined allowable error range, and
   determine that the latch relay is in an open position when the output voltage of the secondary contact has not been input, even if the input voltage of the primary coils has been input.

5. The electric power meter of claim 4, wherein the meter controller comprises a program storage unit configured to determine an error, in a case where an output voltage of the secondary contact has not been input from the latch relay despite a closed status where a control signal for operating the latch relay to a closed position has been output to the latch relay, or in a case where an output voltage of the secondary contact has been input from the latch relay despite an open status where a control signal for operating the latch relay to an open position has been output to the latch relay.

* * * * *